United States Patent [19]
Fritsche et al.

[11] Patent Number: 5,519,314
[45] Date of Patent: May 21, 1996

[54] HIGH DENSITY HARP OR WIRE SCANNER FOR PARTICLE BEAM DIAGNOSTICS

[75] Inventors: Craig T. Fritsche, Overland Park, Kans.; Michael L. Krogh, Lee's Summit, Mo.

[73] Assignee: AlliedSignal Inc., Morristown, N.J.

[21] Appl. No.: 241,773

[22] Filed: May 12, 1994

[51] Int. Cl.[6] ................................................ H01J 37/24
[52] U.S. Cl. ....................................................... 324/158.1
[58] Field of Search .......................... 250/397; 324/71.3, 324/158.1

[56] References Cited

PUBLICATIONS

M. C. Ross et al., "Experience with Wire Scanners at SLC," AIP Conference Proceedings No. 281, Accelerator Instrumentation, Fourth Annual Workshop, Lawrence Berkley Laboratory, Berkley, CA, 1992, pp. 264–270.

M. Ross, "Frontiers of Accelerator Instrumentation," AIP Conference Proceedings 279, Advanced Accelerator Concepts, Port Jefferson, NY, pp. 807–820.

S. D. Ecklund, "Survey of Beam Instrumentation Used in SLC," Proceedings of the Workshop on Advanced Beam Instrumentation, KEK Proceedings 91–2, Ibaraki–ken, Japan, 1991, pp. 77–84.

J. L. Bosser et al., "Beam Instrumentation Foreseen for LHC," Proceedings of the Workshop on Advanced Beam Instrumentation, KEK Proceedings 91–2, Ibaraki–ken, Japan, 1991, pp. 85–94.

*Primary Examiner*—Kenneth A. Wieder
*Assistant Examiner*—Mark Wardas
*Attorney, Agent, or Firm*—Frank B. Flink, Jr.

[57] ABSTRACT

A diagnostic detector head harp (23) used to detect and characterize high energy particle beams using an array of closely spaced detector wires (21), typically carbon wires, spaced less than 0.1 cm (0.040 inch) connected to a hybrid microcircuit (25) formed on a ceramic substrate (26). A method to fabricate harps (23) to obtain carbon wire spacing and density not previously available utilizing hybrid microcircuit technology. The hybrid microcircuit (25) disposed on the ceramic substrate (26) connects electrically between the detector wires (21) and diagnostic equipment (37) which analyzes pulses generated in the detector wires (21) by the high energy particle beams.

12 Claims, 3 Drawing Sheets

HIGH DENSITY HARP OR WIRE SCANNER FOR PARTICLE BEAM DIAGNOSTICS

The U.S. Government has rights in this invention pursuant to contract number DE-AC04-76-DP00613 with the United States Department of Energy.

BACKGROUND OF THE INVENTION

1. Field of the Invention

The present invention relates to a novel harp device for detecting high energy particle beams.

2. Description of the Prior Art

High energy subatomic particle beams typically are diagnosed by use of a detector commonly called a harp. The frame of the harp has an aperture across which a plurality of detector wires extend. Charged particles contact the detector wires and cause electrical pulses. Based upon when, where, and how many charged particles contact the harp detector wires, the shape of the particle beam may be determined.

Prior art harp frames were built using a printed wiring board onto which were soldered the detector wires. Utilizing a printed wiring board for the harp frame and soldering for the detector wire attachment limits the minimum wire spacing obtainable to about 0.1 cm (0.040 inch) on wire centers. For beam diagnosis purposes, denser spacing of the detector wires is desirable in order to more accurately determine the shape of the particle beam.

Although denser spacing may be obtained by offsetting two planes of 0.1 cm (0.040 inch) spaced wires to obtain an effective 0.05 cm (0.020 inch) spacing, this approach results in the harp detector wires being disposed in two planes which is undesirable due to the potential for inaccuracies in diagnostic information derived from the harp.

In prior art harps, carbon fibers typically are utilized for harp detector wires. The carbon wires are prepared for attachment by electroplating the ends of the wires with appropriate solder-wettable materials such as copper followed by tin. The carbon wires are then individually attached utilizing manual soldering techniques.

SUMMARY OF THE INVENTION

The present invention is a high wire density harp, used to sense a high energy particle beam, with detector wire spacing of less than 0.1 cm (0.040 inches) and with detector wires disposed in a single plane. Hybrid microcircuit technology is utilized to form a network on a rigid substrate all of which define the harp frame to increase the density of detector wires, significantly surpassing the wire density available in the prior art.

Application of the detector wires to bonding pads on the harp microcircuit frame requires unique fabrication steps. A wire is wound around a detector wire fabrication frame at the required detector wire spacing. Two points of each wrap of wire are then affixed to one side of the detector wire fabrication frame forming a set of parallel detector wires disposed in one plane. The portions of the detector wires intended for connection to the bonding pads on the harp frame are metallized in preparation for bonding. The detector wire fabrication frame is then positioned over the harp frame so that the metallized portions of the detector wires contact the bonding pads. The detector wires are then solid phase bonded to the bonding pads.

DESCRIPTION OF THE INVENTION

Figure 1A:
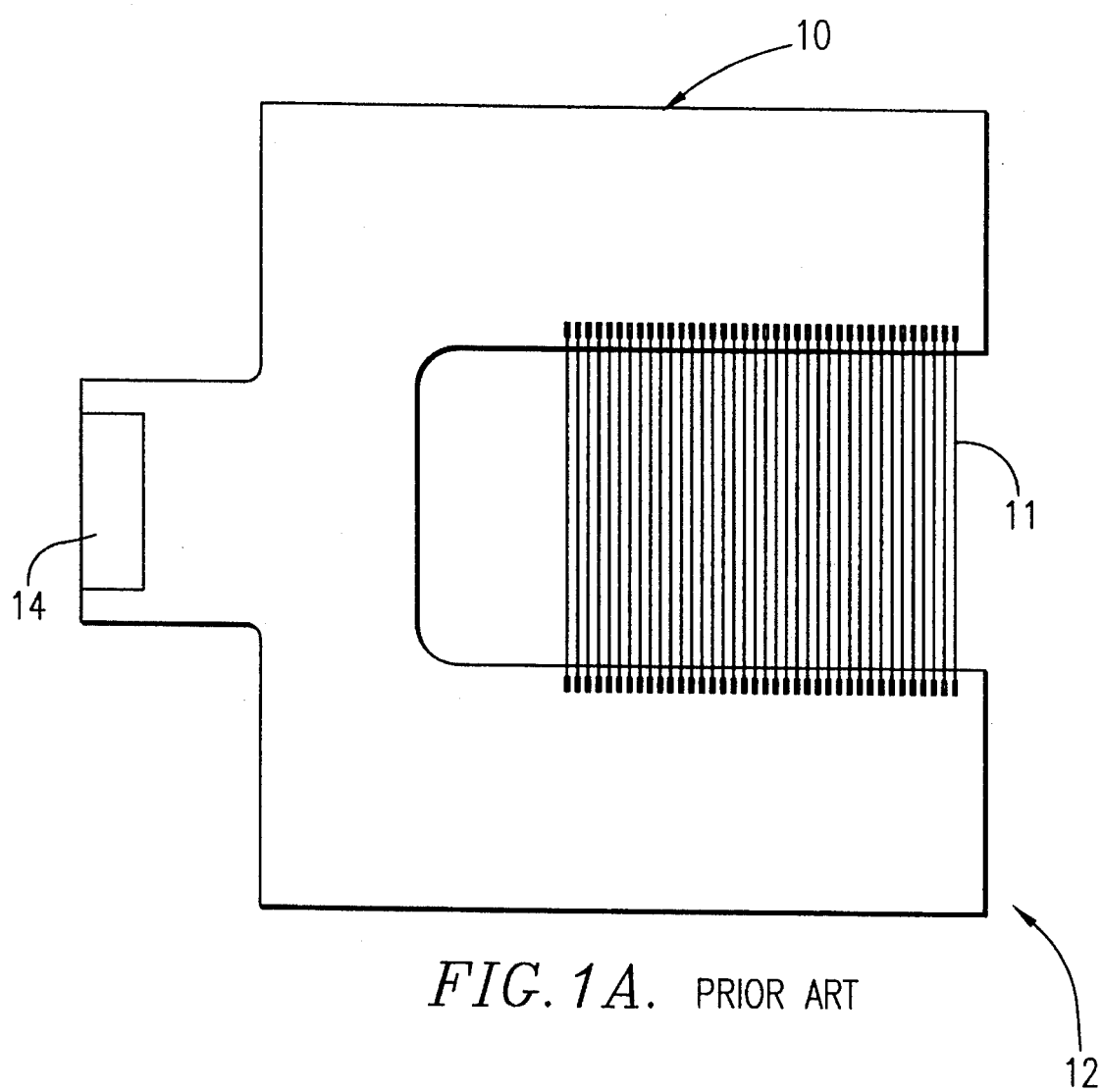
FIGS. 1A and 1B show a side view and a top view of a typical prior art harp utilizing printed wiring board technology.
Figure 1B:
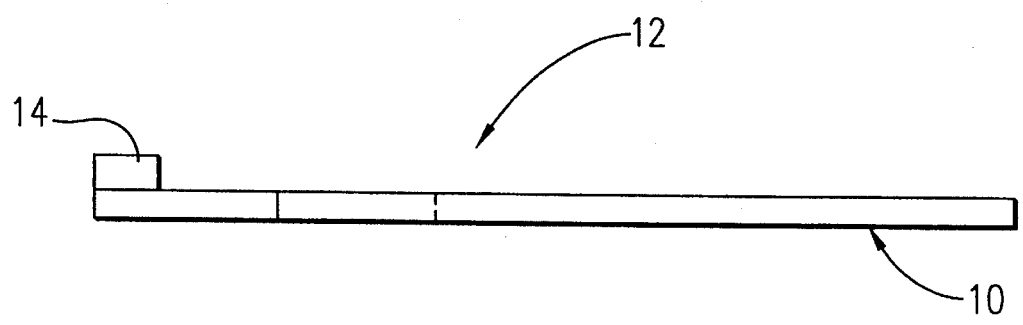

A side view of a typical prior art harp 12 is shown in FIG. 1A. A top view of a prior art harp 12 is shown in FIG. 1B. A harp is comprised of a frame 10 with an aperture across which one or more electrically-conductive detector wires 11 is extended. The prior art harp frame 10 is a printed wiring board limiting the detector wire 11 spacing to 0.1 cm (0.040 inches) or greater on wire centers. Charged particles contacting the detector wires cause electrical pulses. The pulses are routed through conductors contained in the harp frame 10 to a set of connectors 14. The connectors 14 interface with separate diagnostic equipment.

Figure 2A:
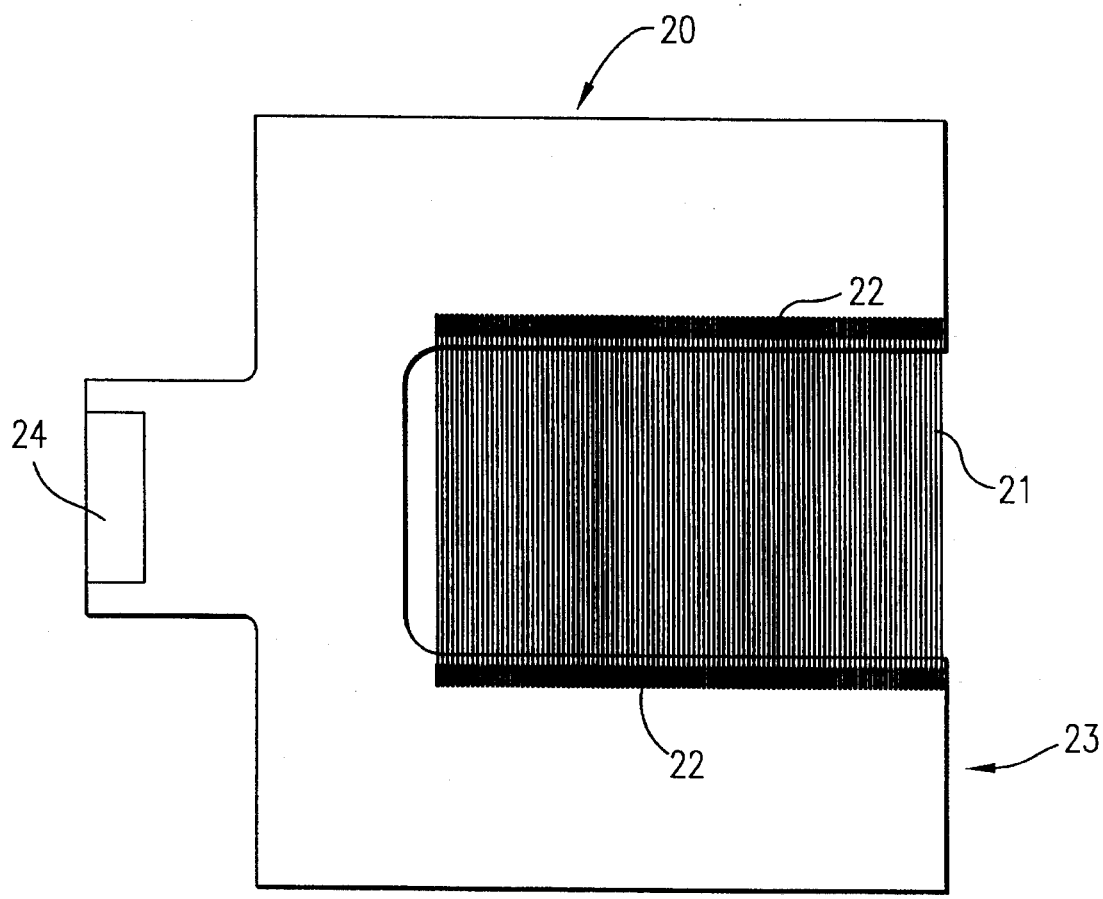
FIG. 2A, 2B, and 2C show a side view, a top view, and an enlarged portion of a top view of a harp according to the present invention utilizing hybrid microcircuit technology.
Figure 2B:
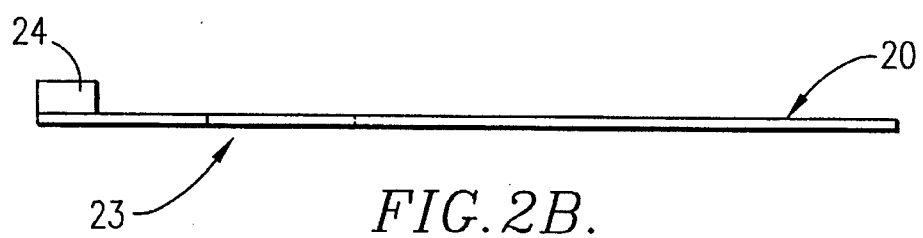
Figure 2C:
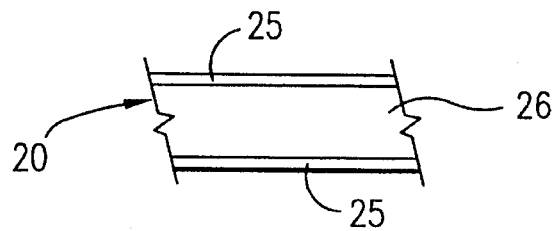

A side view of a non-limiting design for the present invention is shown in FIG. 2A. A top view of the present invention is shown in FIG. 2B. FIG. 2C is an enlarged detail of a portion of FIG. 2B. The present invention is a high wire density harp 23, used to sense a high energy particle beam, with detector wire 21 spacing of less than 0.1 cm (0.040 inches) and with detector wires 21 disposed in a single plane. A novel application of hybrid microcircuit technology is utilized to form a conductor network 25 on a rigid substrate 26 all of which define the harp frame 20. The hybrid microcircuit conductor network 25 forms the bonding pads 22 disposed on each side of the aperture in the harp frame 20 and electrically connects the bonding pads 22 to a set of harp frame connectors 24. The harp detector wires 21 are attached across an aperture in the harp frame 20, to bonding pads 22 formed in the hybrid microcircuit network 25 on and a part of the frame 20. Application of hybrid microcircuit technology increases the density of detector wire spacing significantly surpassing the detector wire spacing density available in the prior art while maintaining the detector wires 21 in a single plane to minimize detection errors. The increased density of detector wire spacing significantly enhances the accuracy of particle beam detection.

As used herein, hybrid microcircuit technology includes both thin and thick film technologies. For a discussion of these technologies, see M. L. Topfer, 1971, "Thick Film Microelectronics," Van Norstrand Reinhold Co., pp. 1–19.

The detector wire spacing obtainable depends upon the type of hybrid microcircuit technology utilized. Thick film networks, which utilize 0.013 cm (0.005 inch) nominal conductor lines and spaces, allow detector wire attachment spacing of 0.025 cm (0.010 inch) on center. Thin film networks, which utilize 0.0025 cm (0.001 inch) nominal conductor lines and spaces, allow wire attachment spacing of 0.005 cm (0.002 inch) on center.

To attach the detector wires to either the thick film or thin film substrates, the wire ends are metallized and then solid-phase bonded in place, as described in the Detector Wire Attachment Process discussion, below.

Figure 3:
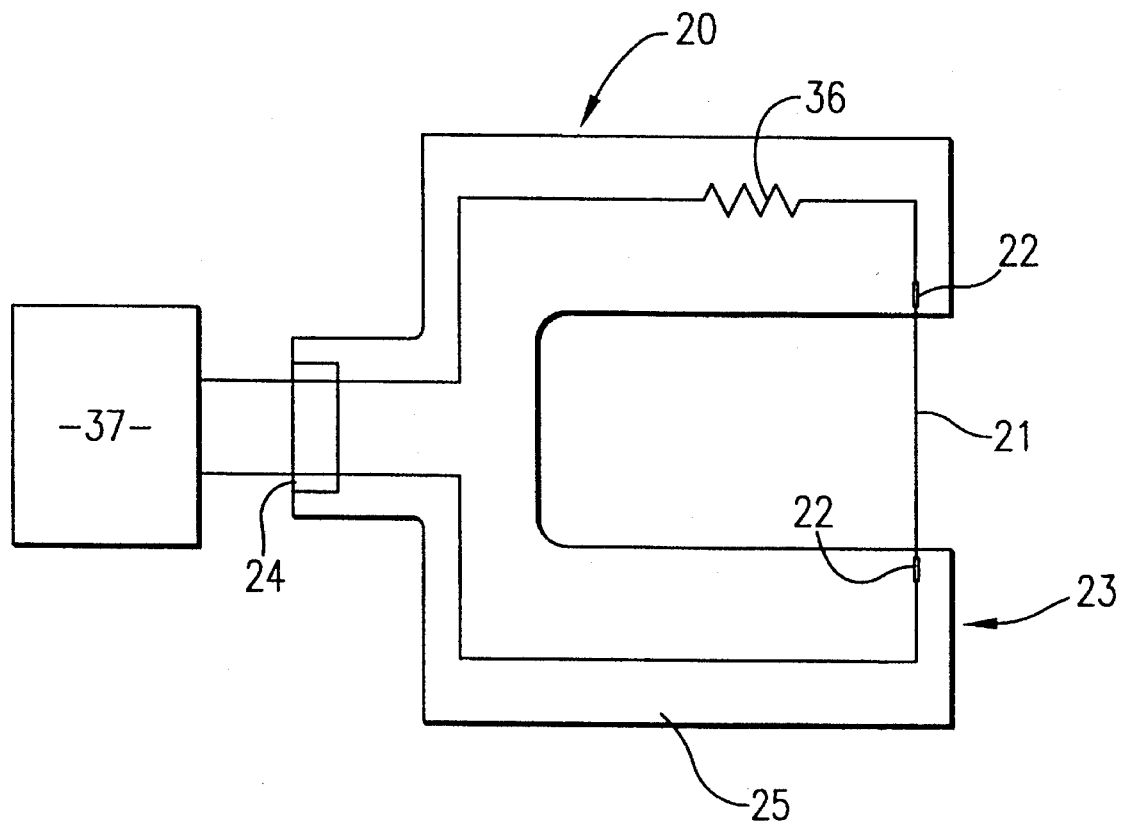
FIG. 3 is a block diagram of a harp according to the present invention interconnected to beam diagnostic equipment.

FIG. 3 is a block diagram depicting a single harp detector wire 21 attached through the hybrid microcircuit network, 25 on FIG. 2C, to the harp frame connectors 24. This diagram shows only one complete harp circuit for clarity. In service, the harp typically is connected to a digitizing apparatus 37 such as is the subject of U.S. patent application No. 08/156,048, the contents of which are incorporated herein by reference, assigned to the same assignee as the present invention. FIG. 3 also shows that an additional benefit of utilizing hybrid microcircuit technology for the harp is that circuit elements 36 can be incorporated into the hybrid microcircuit. For example, a 1 MOhm resistor 36 may be printed in series with the detector wire 21 for use in broken wire detection.

Detector Wire Attachment Process

The high-density detector wire array required the development of a solid-phase bonding technique to attach the detector wires to the bonding pads. The detector wires are positioned and bonded to a prepared harp frame as described below.

Wire for the detector wires is wound around a detector wire fabrication frame a plurality of times such that the plurality of wire segments are parallel to each other at the desired spacing and under tension. Two points of each wrap of wire are then affixed to one side of the detector wire fabrication frame with an appropriate adhesive forming a set of parallel detector wires disposed in one plane.

Next, the portions of the detector wires which are to be affixed to corresponding bonding pads on the harp frame are coated with layers of metal suitable to bond to the detector wire material and to the harp frame bonding pads.

The frame containing the metallized detector wires is then positioned on the prepared bonding pads. The ends of the metallized detector wires are solid-phase bonded to the bonding pads using a parallel gap welding process. The process provides a strong mechanical bond, maintaining wire tensions, without damaging the detector wire.

Preferred Embodiment

The following embodiment of this invention designed for a particular application is instructive to describe a workable configuration. The application required a harp embodiment comprised of 128 33-micron detector wires 21, refer to FIG. 2A, set on 0.38 mm (0.015 inch) centers with all detector wires 21 in a single plane.

To accommodate the detector wire spacing requirements, the harp frame 20 utilizes thick film hybrid microcircuit technology. Gold thick film inks form both conductor lines and detector wire bond pads while gold/platinum combination ink is used for pads at the connectors 24. The microcircuit printing is performed on a 0.1 cm (0.040 inch) thick alumina substrate. Three thick film conductor layers are printed on each side of the alumina substrate. The alumina substrate is laser bored to allow thick-film conductors to pass through. The thick film approach generally is desirable where the detector wire spacing allows its use because of the greater durability relative to thin film networks. Similarly, gold conductor inks are preferred because of their greater corrosion resistance as compared to other potential selections such as copper. The gold/platinum connector pads allow standard miniature connectors to be surface mount soldered without leaching the pads off the substrate.

The detector wires 21 in the preferred embodiment are carbon fiber. To prepare the detector wires 21 for attachment to the harp frame 20, the detector wires 21 are wound onto a standard Herman-size (9.5×16 cm, 3.75×4.5 inch) metallized ceramic fabrication frame. Wire on one face of the frame is attached with epoxy along two lines in the plane of, but perpendicular to, the detector wires and located to leave an unattached center portion of each wire for attachment to the harp frame. Excess wire is removed from the fabrication frame. The fabrication frame is then masked so as to expose only the portions of the detector wires to be attached to the bonding pads. The masked frame is then sputtered with approximately 1500 Å of titanium, followed by approximately 2500 Å of palladium in a vacuum deposition chamber. The mask is then removed. Following the vacuum deposition operation, the fabrication frame is overlaid with a stencil to mask ends of the wires, leaving the center portion of the wires exposed. Photoresist is then applied to the center region of the wires which extend across the aperture in the harp frame. The fabrication frame and wires are then electroplated with approximately 0.013 mm (500 microinches) of gold. The photoresist prevents deposition of gold on the center region of the wires.

The fabrication frame with the prepared detector wires 21 is then positioned on the harp frame so that the prepared ends of the detector wires are adjacent to the bonding pads 22. The detector wires 21 are then bonded to the harp frame bonding pads 22 using a parallel gap welding process.

What is claimed is:

1. A harp high energy particle beam detection device for connection to an electrical signal sensing means comprising:

a frame having a first side and a second side and an aperture therein disposed between said first side and said second side and through which the high energy beam may pass;

a plurality of detector wires which are electrically-conducting mounted on said frame, each wire having a first end and a second end; and hybrid microcircuit means disposed upon said first side and said second side of said frame for mechanically bonding said first detector wire end and said second detector wire end so that said plurality of detector wires are parallel to each other, are in the same plane, and extend across said aperture and for providing electrical paths between said plurality of detector wires and the electrical signal sensing means.

2. A harp high energy beam detection device as claimed in claim 1 wherein said hybrid microcircuit means is a thick film conductor network.

3. A harp high energy beam detection device as claimed in claim 1 wherein said hybrid microcircuit means is a thin film conductor network.

4. A harp high energy beam detection device as claimed in claim 1 wherein said hybrid microcircuit means includes broken wire detection resistors.

5. A harp high energy beam detection device as claimed in claim 1 wherein said detector wires are spaced less than 0.05 cm (0.020 inch) on center and wherein said detector wires include carbon fiber wires.

6. A harp high energy beam detection device as claimed in claim 1 wherein said means for mechanically bonding said detector wires to said hybrid microcircuit means includes parallel gap welded metallized detection wires.

7. A harp high energy particle beam detection device comprising:

a frame having a first side and a second side and an aperture therein disposed between said first side and said second side and through which the high energy beam may pass;

a plurality of detector wires which are electrically-conducting mounted on said frame, each wire having a first end and a second end;

means for sensing electrical signals generated in said plurality of electrically-conducting wires; and hybrid microcircuit means disposed upon said first side and said second side of said frame for mechanically bonding said first detector wire end and said second detector wire end so that said plurality of detector wires are parallel to each other, are in the same plane, and extend across said aperture and for providing electrical paths between said plurality of detector wires and said electrical signal sensing means.

8. A harp high energy beam detection device as claimed in claim 7 wherein said hybrid microcircuit means is a thick film conductor network.

9. A harp high energy beam detection device as claimed in claim 7 wherein said hybrid microcircuit means is a thin film conductor network.

10. A harp high energy beam detection device as claimed in claim 7 wherein said hybrid microcircuit means includes broken wire detection resistors.

11. A harp high energy beam detection device as claimed in claim 7 wherein said detector wires are spaced less than 0.05 cm (.020 inch) on center and wherein said detector wires include carbon fiber wires.

12. A harp high energy beam detection device as claimed in claim 7 wherein said means for mechanically bonding said detector wires to said hybrid microcircuit means includes parallel gap welded metallized detection wires.

* * * * *